United States Patent [19]

Kawashima

[11] 4,322,626
[45] Mar. 30, 1982

[54] METHOD OF ELECTRON BEAM EXPOSURE

[75] Inventor: Kenichi Kawashima, Yokohama, Japan

[73] Assignee: Fujitsu Limited, Kawasaki, Japan

[21] Appl. No.: 162,877

[22] Filed: Jun. 25, 1980

[30] Foreign Application Priority Data

Jun. 27, 1979 [JP] Japan .................................. 54/81075

[51] Int. Cl.³ ........................ A61K 27/02; G01K 1/08
[52] U.S. Cl. .................................. 250/492.2; 250/400
[58] Field of Search ............................ 250/492 A, 400

[56] References Cited

U.S. PATENT DOCUMENTS 4,008,402 2/1977 O'Keeffe et al. ................ 250/492 A

*Primary Examiner*—Harold A. Dixon

[57] ABSTRACT

A method of electron beam exposure for directly writing patterns on chips of a semiconductor wafer with an electron beam, in which each of the chips is sectioned into a plurality of exposure fields, and at least one alignment mark is formed in only one exposure field of eachg chip. The alignment of the entire wafer with the electron beam is preliminarily adjusted, the alignment of a particular chip with the electron beam is adjusted relying on the alignment mark on the chips, and the exposure fields of the desired chip are successively exposed to the electron beam so that the entire chip is exposed. The remaining chips are successively adjusted in alignment and exposed in the same manner as defined above, whereby the entire wafer is exposed.

10 Claims, 4 Drawing Figures

METHOD OF ELECTRON BEAM EXPOSURE

BACKGROUND OF THE INVENTION

This invention relates to an electron beam lithographic microfabrication technology which can be applied to the fabrication of electronic microcircuit devices, for example, such as an LSI (Large Scale Integrated Circuit) or VLSI (Very Large Scale Integrated Circuit). More specifically, this invention relates to a method of electron beam exposure for directly writing patterns on a semiconductor wafer with an electron beam and, particularly, to a method for aligning of an exposure field on a wafer with an electron beam.

For increasing the degree of integration of an LSI, a technique has been developed to form minute and precise patterns using an electron beam exposure method. Among the variety of electron beam exposure methods, a direct exposure method adapted to directly write patterns on chips of a semiconductor wafer makes it possible to form very accurate patterns, and, accordingly, this method has been extensively used for the formation of electrically conductive wiring layers or the like.

In conventional photolithography using an ultraviolet ray exposure, a patterning mask is aligned with the wafer relying on alignment marks, and the accuracy of the mask alignment affects greatly the accuracy of the pattern. However, the electron beam direct exposure method requires a far higher accuracy of alignment of the exposure field on the wafer.

There is a conventional direct exposure method, in which a single exposure field is equivalent to one chip, wherein four rectangular marks, for example, are formed in the peripheral region of the chip, and the chip is brought into alignment with the electron beam by scanning the marks in the peripheral region and correcting the scanning field of the electron beam accordingly, and thereafter the chip is exposed to the electron beam for writing the pattern. Adjusting the alignment for each of the chips ensures a high accuracy of alignment. In recent years, however, there has been a tendency for semiconductor chips (used for memory devices, for example) to be made larger in size. In this case, the exposure field is made larger in size, and the scan field of the electron beam is also, correspondingly, made larger. Therefore, the area which is equivalent to a single bit in a D/A (digital-to-analogue) converter for beam control is increased, and, accordingly, the accuracy of alignment is decreased. Furthermore, there exists a problem in that a chip having a very large size cannot be scanned by the existing electron beam exposure system. For example, to ensure a pattern accuracy of within 0.2 $\mu$m, the exposure field should usually be about 2 mm$\times$2 mm. If the field is 5 mm$\times$5 mm, the alignment accuracy is decreased remarkably, and if the field size is larger than 5 mm$\times$5 mm, it is difficult to scan the exposure field with the electron beam at all.

In another conventional method, three or more marks are formed in the peripheral region of the semiconductor wafer, and the alignment of the exposure field with the electron beam is periodically adjusted relying on the marks during the scanning process for exposure. According to this method, however, errors in alignment which stem from deformations, curvature or irregularities of the wafer cannot be corrected, and, accordingly, the alignment accuracy is not very high.

SUMMARY OF THE INVENTION

It is, therefore, a primary object of the present invention to provide an electron beam exposure method which makes it possible to accurately attain alignment of an exposure field on a wafer.

Another object of the present invention is to provide an electron beam exposure method which makes it possible to expose chips having large sizes.

According to one embodiment of the present invention, there is provided a method of electron beam exposure for directly writing patterns on chips of a semiconductor wafer with an electron beam, in which each of the chips is sectioned into a plurality of exposure fields, at least one alignment mark is formed in only one exposure field of each chip, an alignment of the entire wafer with the electron beam is preliminarily adjusted, an alignment of a desired chip with the electron beam is adjusted relying on said alignment mark therein, the exposure fields of the desired chip are successively exposed to the electron beam so that the entire chip is exposed, and the remaining chips are successively adjusted in alignment and exposed in the same manner as defined above, whereby the entire wafer is exposed.

According to another embodiment of the present invention, there is provided an electron beam exposure method, which is similar to the above mentioned method according to the first aspect of the present invention, except that at least one alignment mark is formed in only one exposure field of only one chip of a group of adjacent chips, an alignment of a desired group of chips including the chip having the alignment marks therein with the electron beam is adjusted relying on the alignment mark therein, and the exposure fields of the group of chips are successively exposed to the electron beam.

The present invention will become apparent from the following description of preferred embodiments with reference to the accompanying drawings.

DESCRIPTION OF THE PREFERRED EMBODIMENTS

Figure 1:
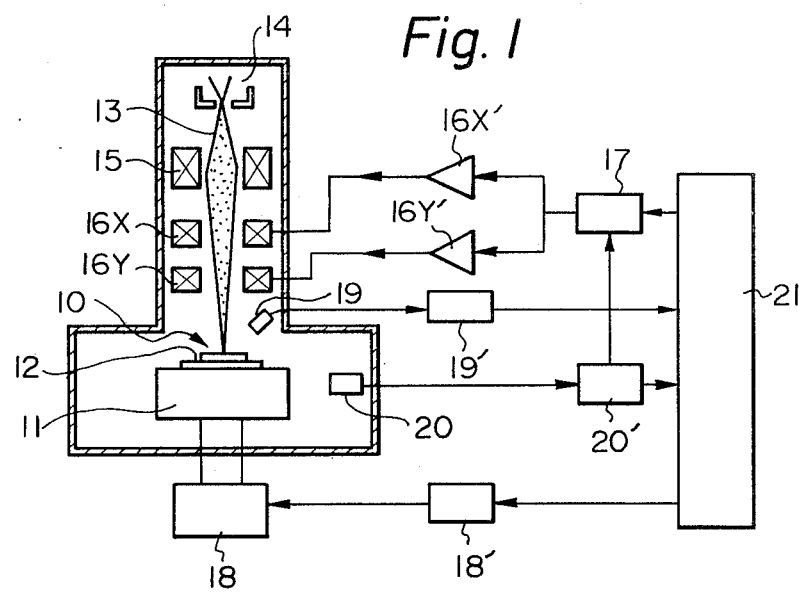
FIG. 1 illustrates an outline of an electron beam exposure system used for performing an electron beam exposure method according to the present invention.

In FIG. 1, there is illustrated an electron beam exposure system, which is used to directly write patterns on a semiconductor wafer by means of an electron beam. A semiconductor wafer 10, which will be described in detail hereinafter, is positioned on a stage 11 by means of a wafer holder 12. An electron beam 13 is emitted from an electron gun 14, converged by a lens 15, and deflected by deflectors 16X and 16Y, and finally irradiates the wafer 10. The deflectors 16X and 16Y are connected, via amplifiers 16X' and 16Y', to a D/A (digital-to-analogue) converter 17. The stage 11 is associated with a driving mechanism 18 which is connected to a drive circuit 18'. A detector 19 is provided for detecting reflected electrons, and this detector is connected to a detector circuit 19'. Furthermore, a laser length-measuring instrument 20 is provided for detecting the position of the stage 11, and this instrument 20 is connected to a detector circuit 20'. The D/A converter 17, drive circuit 18', and detector circuits 19' and 20' are connected to an electronic computer 21. The computer 21 is organized to perform computation, based on the information stored therein and the data detected by the detector 19 and the laser length-measuring instrument 20, so as to produce instructions necessary to carry out the exposure operation. The electron beam exposure system, as mentioned above, is well known, and, therefore, will not be described in more detail in this specification.

Figure 2:
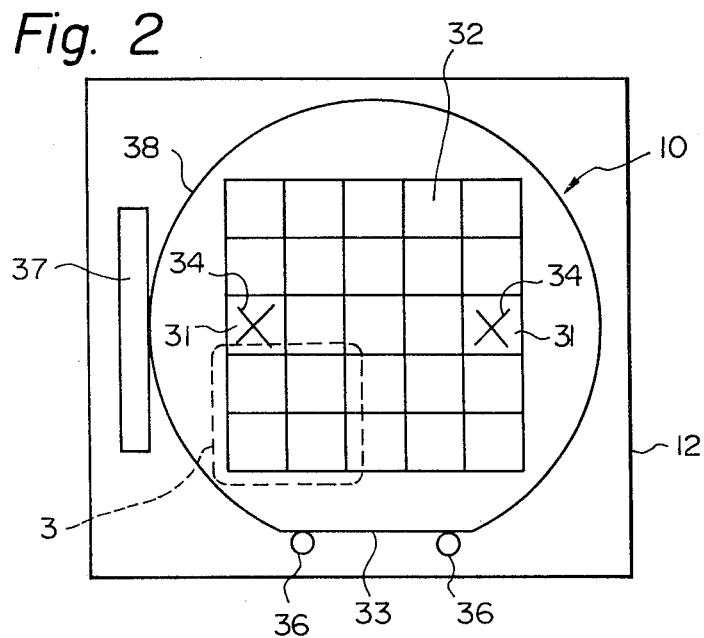
FIG. 2 illustrates a schematic plan view of a semiconductor wafer on which microcircuit patterns are written by the method of the present invention, the wafer being illustrated on a wafer holder.
Figure 3:
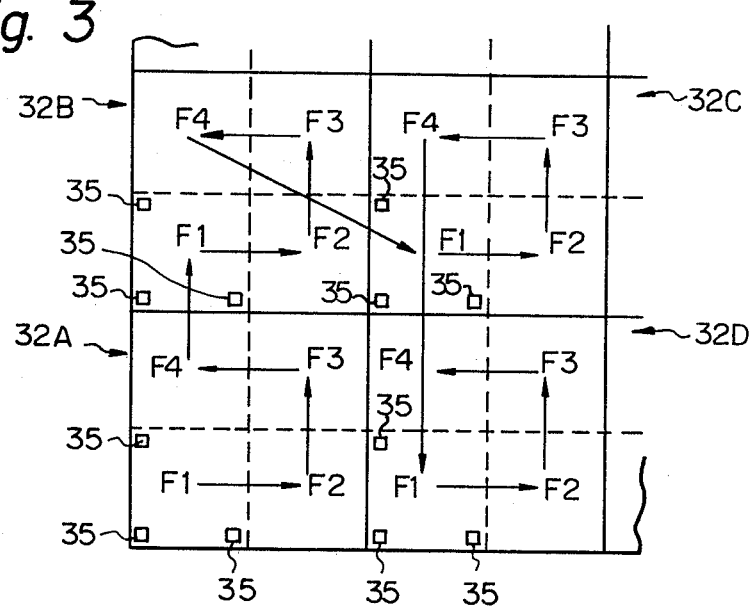
FIG. 3 is an enlarged plan view of a part of the wafer designated by reference 3 in FIG. 2, illustrating an example of the mark arrangement and an example of the sequence of exposures.

Referring to FIG. 2, a semiconductor wafer 10 has two mark regions 31 and a plurality of chips 32 thereon. The mark regions 31 are arranged in parallel to a facet 33 of the wafer 10 and have two cross-shaped reference marks 34 therein. The reference mark 34 has a size, for example, of about 200 μm in both length and breadth. In FIG. 3, four chips are particularly designated by references 32A, 32B, 32C, and 32D, respectively, for purposes of distinction from each other. Each of the chips 32 has an area which is sectioned into four exposure fields, as designated by references F1, F2, F3, and F4, and only one exposure field F1 of each chip has three square alignment marks 35. The other exposure fields F2, F3, and F4 of each chip have no marks. Each of the exposure fields F1 through F4 has a size of 2 mm or less in both length and breadth. The alignment mark 35 is about 10 μm square, for example. The reference marks 34 (FIG. 2) and the alignment marks 34 (FIG. 3) are in the form of recesses of 1 μm in depth, and these marks are formed in the previous step of patterning.

The semiconductor wafer 10 formed as mentioned above is positioned on the stage 11 by means of the wafer holder 12. Referring again to FIG. 2, the wafer holder 12 has two abutments 36 against which the facet 33 of the wafer 10 abuts, and an abutment 37 against which the curved peripheral surface 38 abuts, whereby the wafer 10 is mechanically aligned with respect to the electron beam 13 with an accuracy within ±100 μm.

In the operation of the electron beam exposure system, first the stage 11 is moved so that the reference marks 34 are scanned by the electron beam. Reflected electron signals are detected by the detector 19, and X and Y coordinates of the two reference marks 34 are detected. If there are differences between the detected coordinates and the desired coordinates, the wafer is rotated and the center position is shifted, so that the entire wafer is brought into alignment with the electron beam.

After the alignment (pre-alignment) of the wafer with the electron beam has been attained in the manner mentioned above, the stage is moved so that the exposure field F1 of a desired chip 32A, for example, is positioned under the electron beam, and the three alignment marks 35 in the exposure field F1 are scanned by the electron beam in both the direction X and the direction Y. In the same manner as mentioned above, reflected electron signals are detected by the detector 19, and X and Y coordinates of the three alignment marks 35 are detected. If there are differences between the detected coordinates and the desired coordinates, these differences are corrected to attain an accurate alignment of the chip 32A with respect to the electron beam. This correction of the differences is attained by adjusting the gain, rotation, and offset in the deflectors 16X and 16Y. Therefore, if the center positions of the marks 35 are out of alignment with the X direction and the Y direction, the rotation is adjusted; if there is a difference in the scanning range of the electron beam, the gain of the amplifiers 16X' and 16Y' attached to the D/A converter 17 is adjusted; and if there is a difference in the lateral position of the stage, the offset is adjusted, so that an accurate alignment is attained. These operations are carried out by the electronic computer 21.

After accurate alignment of the chip 32A with the electron beam has been attained in the manner as mentioned above, the exposure field F1 of the chip 32A is scanned with the electron beam and is exposed. Then, the stage 11 is moved while the movement of the stage is measured by the laser length-measuring instrument 20, so that the next exposure field F2 of the chip 32A is positioned under the electron beam, and thereafter the exposure field F2 is exposed by being scanned with the electron beam. If there is an error in the lateral position of the stage, the offset is corrected to attain an accurate alignment. In this case, the usual known dynamic correction technique may be used for attaining the correction of the offset rapidly.

In the same manner as mentioned above, the remaining exposure fields F3 and F4 of the chip 32A are successively exposed by moving the stage, while correcting the offset only, so that the whole chip 32A is exposed.

Subsequently, the stage 11 is moved so that the exposure field F1 of the chip 32B is positioned under the electron beam, then an accurate alignment is attained relying on the alignment marks 35, and the exposure fields F1 through F4 are successively exposed in the same manner as explained regarding the previous chip 32A. Similarly, the subsequent chips 32C, 32D, . . . are successively aligned and exposed, whereby the entire semiconductor is exposed.

Figure 4:
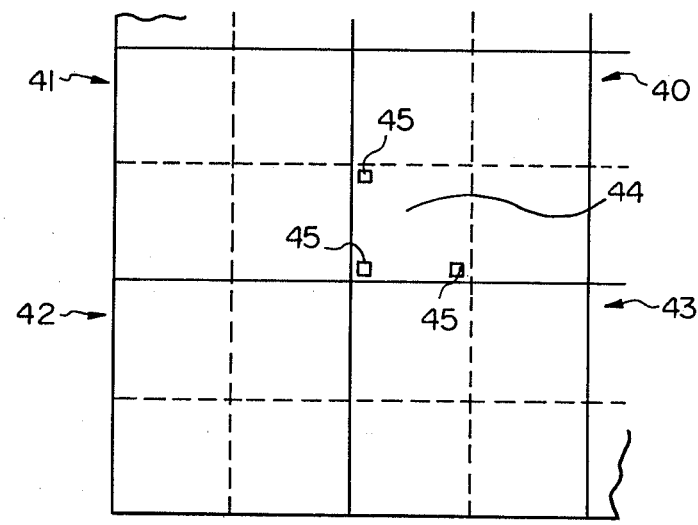
FIG. 4 is a view similar to FIG. 3, but illustrating another embodiment of the present invention.

Referring to FIG. 4, there is illustrated another embodiment of the present invention in which, also, each chip of a group of adjacent semiconductor chips 40, 41, 42, and 43 is sectioned into four exposure fields, but, within the whole chips, only the exposure field 44 of the chip 40 has the three alignment marks 45. The exposure field 44 is brought into alignment with the electron beam relying on the alignment marks 45 and, thereafter, all of the exposure fields of the group of chips 40 through 43 are successively scanned by the electron beam for patterning.

Although not illustrated in the drawings, only one alignment mark may be formed in any single exposure field of each, or only a desired one within each group, of the chips, provided that the deformations, curvature, and irregularities are small over the entire area of the wafer. This is because it is unnecesary to correct the size of the exposure field, i.e. the gain of the scanning range of the electron beam, in this case. However, the rotation of the exposure field should be corrected relying on other means, for example, the reference marks which are provided for the pre-alignment, as mentioned above.

According to the present invention, as mentioned above, the alignment of the exposure field is adjusted by detecting the alignment marks formed in one of the narrow exposure fields into which the chip is sectioned. Therefore, the region which is equivalent to a single bit in the D/A converter of the electron beam exposure system is small, and accordingly alignment can be attained with an accuracy of about 0.2 μm. This accuracy can be maintained within each single chip or group of chips, as mentioned before, because the deformations, curvature, or irregularities in such restricted regions are not very large. Such accurate alignment makes it possible to carry out an accurate electron beam exposure.

There is another advantage of the present invention in that it is possible to expose a chip having a very large size of, for example, about 10 to 20 mm.

Furthermore, the method of the present invention has an important advantage in that it permits very accurate alignment to be attained in a very short time and, accordingly, it is possible to greatly decrease the period of time required for the exposure of the entire wafer.

Consequently, the present invention is very effective for the fabrication of large and highly integrated semiconductor elements, such as an LSI.

It should be understood that the present invention has been described above in detail with particular reference to the preferred embodiments thereof, but variations and modifications can be made within the spirit and scope of the invention.

I claim:

1. A method of electron beam exposure, for directly writing patterns on chips of a semiconductor wafer with an electron beam, comprising the steps of:
   (a) apportioning each of said chips into a plurality of exposure fields and forming at least one alignment mark in only one of said exposure fields of each said chip;
   (b) preliminarily adjusting the alignment of the entire wafer by means of the electron beam;
   (c) adjusting the alignment of an individual one of said chips by means of the electron beam in accordance with said alignment mark on said individual chip;
   (d) successively exposing said exposure fields of said individual chip to the electron beam, thereby exposing desired portions of said chip; and
   (e) successively exposing the remaining ones of said chips by performing the above defined steps (c) and (d) for each chip, whereby desired portions of the entire wafer are exposed.

2. A method according to claim 1, wherein said step of adjusting the alignment of said individual chip is performed by
   moving the wafer so that the one of said exposure fields which has said alignment marks therein is positioned under the electron beam,
   detecting said alignment marks by scanning them with the electron beam, and
   correcting the gain, rotation, and offset of the scanning field of the electron beam.

3. The method of claim 2, wherein said step of exposing said exposure fields of said individual chip is performed by moving the wafer so that said exposure fields are successively positioned under the electron beam, while correcting the offset of the scanning field of the electron beam only.

4. A method according to claim 1, wherein said step of exposing said exposure fields of said individual chip is performed by moving the wafer so that said exposure fields are successively positioned under the electron beam, while correcting the offset of the scanning field of the electron beam only.

5. A method according to claim 1, 2, 4, or 3, wherein three alignment marks are formed in one said exposure field of each said chip.

6. The method of claim 2 or 3, wherein said detecting step comprises detecting the reflected electrons scattered by the electron beam from said alignment mark.

7. The method of claim 1, 2, 4, or 3, wherein only one alignment mark is formed in one said exposure field of each said chip.

8. A method of electron beam exposure for directly writing patterns on chips of a semiconductor wafer with an electron beam, comprising the steps of:
   (a) apportioning each of said chips into a plurality of exposure fields, and forming at least one alignment marks in only one said exposure field of one marked chip, among all said exposure fields of a group of adjacent chips;
   (b) preliminarily adjusting the alignment of the entire wafer by means of the electron beam;
   (c) adjusting the alignment of a desired group of chips including said marked chip having the alignment mark therein with the electron beam, relying on said alignment mark of said marked chip;
   (d) successively exposing said exposure fields of said group of chips to the electron beam, thereby exposing desired portions of the entirety of said group of chips; and
   (e) successively exposing the remaining ones of said groups of chips by performing said above defined steps (c) and (d) for each said group of chips, whereby desired portions of the entire wafer are exposed.

9. The method of claim 8, wherein three alignment marks are formed in one said exposure field of said marked chip.

10. The method of claim 8, wherein only one alignment mark is formed on one said exposure field of said marked chip.

* * * * *

UNITED STATES PATENT AND TRADEMARK OFFICE
CERTIFICATE OF CORRECTION

PATENT NO. : 4,322,626
DATED : March 30, 1982
INVENTOR(S) : Kenichi Kawashima

It is certified that error appears in the above—identified patent and that said Letters Patent is hereby corrected as shown below:

Front page, Col. 2, after first line, insert new line
--Attorney, Agent, or Firm - Staas & Halsey--;

[57] Abstract, line 6, "eachg" should be --each--;

line 10, "chips" should be --chip--;

Col. 1, line 14, after "aligning" delete "of";

Col. 3, line 35, "34" (second occurrence) should be --35--;

Col. 4, line 45, after "whole" insert --group of--;

Signed and Sealed this

Nineteenth Day of October 1982

|SEAL|

Attest:

Attesting Officer

GERALD J. MOSSINGHOFF

Commissioner of Patents and Trademarks